United States Patent
Eyole et al.

(10) Patent No.: US 11,061,852 B2
(45) Date of Patent: Jul. 13, 2021

(54) RECONFIGURABLE CIRCUIT ARCHITECTURE

(71) Applicant: Arm Limited, Cambridge (GB)

(72) Inventors: Mbou Eyole, Soham (GB); Emre Ozer, Buckden (GB); Xabier Iturbe, Cambridge (GB); Shidhartha Das, Upper Cambourne (GB)

(73) Assignee: Arm Limited, Cambridge (GB)

( * ) Notice: Subject to any disclaimer, the term of this patent is extended or adjusted under 35 U.S.C. 154(b) by 0 days.

(21) Appl. No.: 16/645,993

(22) PCT Filed: Sep. 25, 2018

(86) PCT No.: PCT/GB2018/052714
§ 371 (c)(1),
(2) Date: Mar. 10, 2020

(87) PCT Pub. No.: WO2019/069048
PCT Pub. Date: Apr. 11, 2019

(65) Prior Publication Data
US 2020/0226095 A1 Jul. 16, 2020

(30) Foreign Application Priority Data
Oct. 6, 2017 (GB) ..................... 1716400

(51) Int. Cl.
*G11C 7/00* (2006.01)
*G06F 15/78* (2006.01)
(Continued)

(52) U.S. Cl.
CPC ........ *G06F 15/7867* (2013.01); *G11C 14/009* (2013.01); *H03K 19/17728* (2013.01); *G06F 2015/763* (2013.01); *G06F 2015/768* (2013.01)

(58) Field of Classification Search
CPC ........... G06F 15/7867; G06F 2015/763; G06F 2015/768; G11C 14/009; H03K 19/17728
See application file for complete search history.

(56) References Cited

U.S. PATENT DOCUMENTS 6,493,272 B1 * 12/2002 Fujii .................... G11C 7/1051
365/189.05
7,081,771 B2 * 7/2006 Agrawal .......... H03K 19/17732
326/38
(Continued)

FOREIGN PATENT DOCUMENTS

CN 101097778 A 1/2008
CN 102184721 B 1/2014
(Continued)

OTHER PUBLICATIONS

European Patent Office, International Search Report and Written Opinion, PCT/GB2018/052714, dated Dec. 11, 2018.
(Continued)

*Primary Examiner* — Kurtis R Bahr
(74) *Attorney, Agent, or Firm* — Leveque Intellectual Property Law, P.C.

(57) ABSTRACT

A method of reconfiguration and a reconfigurable circuit architecture comprising a configurable volatile storage circuit and Non-Volatile Memory circuit elements; wherein the Non-Volatile memory circuit elements store multiple bit states for re-configuration, the multiple bit states being read from the Non-Volatile memory circuit elements and written into the configurable volatile storage circuit for reconfiguration. The Non-Volatile Memory circuit elements and the configurable volatile storage circuit are provided on a common die.

16 Claims, 7 Drawing Sheets

(51) Int. Cl.
    *G11C 14/00*     (2006.01)
    *H03K 19/17728*     (2020.01)
    *G06F 15/76*     (2006.01)

(56) References Cited

U.S. PATENT DOCUMENTS

| | | | |
|---|---|---|---|
| 7,081,773 B1 * | 7/2006 | May | H03K 19/17752 |
| | | | 326/38 |
| 7,359,232 B2 * | 4/2008 | Niedermeier | G11C 7/1006 |
| | | | 365/154 |
| 7,378,873 B1 * | 5/2008 | Tang | H03K 19/17744 |
| | | | 326/38 |
| 2004/0017724 A1 | 1/2004 | Kubota et al. | |
| 2008/0094175 A1 | 4/2008 | Mullet et al. | |
| 2008/0106926 A1 | 5/2008 | Brubaker et al. | |
| 2011/0297912 A1 * | 12/2011 | Samachisa | G11C 16/10 |
| | | | 257/5 |
| 2014/0176187 A1 | 6/2014 | Jayasena et al. | |
| 2017/0011797 A1 * | 1/2017 | Kolodny | G11C 13/0007 |

FOREIGN PATENT DOCUMENTS

| | | |
|---|---|---|
| EP | 1443417 A1 | 8/2004 |
| EP | 1667327 A2 | 6/2006 |
| GB | 2356715 A | 5/2001 |
| WO | 2008014494 A2 | 1/2008 |
| WO | 2015121868 A1 | 8/2015 |

OTHER PUBLICATIONS

Takata et al., "Nonvolatile SRAM based on Phase Change," 21st IEEE Non-Volatile Semiconductor Memory Workshop 2006, NVSMW 2006, 2006: 95-96.

* cited by examiner

RECONFIGURABLE CIRCUIT ARCHITECTURE

The present techniques relate to reconfigurable circuit architectures. Such architectures include a three-dimensional configuration cache for simultaneously deploying multiple configurations in hardware such as Field Programmable Gate Arrays (FPGAs) and Coarse-Grained Reconfigurable Arrays (CGRAs). Furthermore, the techniques relate to reconfigurable circuit architectures incorporating a correlated electron material and methods of operation and programming thereof.

A reconfigurable circuit architecture or programmable system on chip is built on programmable logic. Such architectures are becoming increasingly common due to a customer demand for flexibility in the definition, design and deployment of computing systems and its structure can be modified by the end-user, either at compile time or at run-time by way of a full or partial reconfiguration. However, the current generation of reconfigurable architectures: FPGAs and CGRAs suffer from problems associated with the large area required to store configurations and the high-power dissipation of the configuration memory.

Present techniques seek to address these problems by in part improving the functional density and power profile of FPGAs and CGRAs.

Accordingly, in a first aspect of present techniques there is provided a reconfigurable circuit architecture comprising a configurable volatile storage circuit and Non-Volatile Memory circuit elements; wherein the Non-Volatile memory circuit elements store multiple bit states for re-configuration, the multiple bit states being read from the Non-Volatile memory circuit elements and written into the configurable volatile storage circuit for reconfiguration, wherein the Non-Volatile Memory circuit elements and the configurable volatile storage circuit are provided on a common die.

Accordingly, in a second aspect of present techniques there is provided a machine implemented method of reconfiguration comprising storing multiple bit states for reconfiguration in non-volatile memory circuit elements; reading the multiple bit states from the non-volatile memory circuit elements; and writing the multiple bit states into a configurable volatile storage circuit, wherein the non-volatile memory circuit elements and the configurable volatile storage circuit are provided on a common die.

In embodiments, a stack of CeRAM (Correlated electron Random Access Memory) cells are used in metal layers above FPGA or CGRA logic to store multiple configurations. Such an arrangement provides an energy-efficient system for reloading the active configuration bits at runtime.

A CeRAM device formed when a transition-metal-oxide (TMO) is sandwiched between metal layers has two phase states: metal and insulator, which are characterized by a phase change which changes the physical (or material) and electrical (dieletric) properties. Such a device is fundamentally different from other non-volatile memory technologies such as Resistive RAM (ReRAM) or Spin-Transfer Torque RAM (STT-RAM or STT-MRAM). Unlike ReRAM which requires a filament or conducting path to be formed using an applied critical bias, CeRAM is more robust because it requires an applied critical bias and a critical current—therefore, it achieves not only resistance switching but high fidelity dielectric switching as well.

As a result of these differences in construction and operation, CeRAM devices can have better endurance than ReRAM and require lower supply voltages. In addition, relative to STT-RAM, CeRAM devices require smaller amounts of energy for accessing memory cells.

The techniques are diagrammatically illustrated, by way of example, in the accompanying drawings, in which.

Figure 1A:
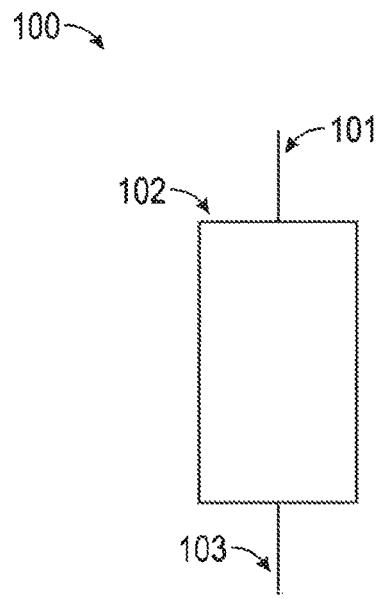
FIG. 1A is block diagram of an example embodiment of a correlated electron switch device comprising a correlated electron material, in accordance with an embodiment.

Reference is made in the following detailed description to accompanying drawings, which form a part hereof, wherein like numerals may designate like parts throughout to indicate corresponding and/or analogous components. It will be appreciated that components illustrated in the figures have not necessarily been drawn to scale, such as for simplicity and/or clarity of illustration. For example, dimensions of some components may be exaggerated relative to other components. Further, it is to be understood that other embodiments may be utilized. Furthermore, structural and/or other changes may be made without departing from claimed subject matter. It should also be noted that directions and/or references, for example, such as up, down, top, bottom, and so on, may be used to facilitate discussion of drawings and/or are not intended to restrict application of claimed subject matter. Therefore, the following detailed description is not to be taken to limit claimed subject matter and/or equivalents.

References throughout this specification to one implementation, an implementation, one embodiment, an embodiment and/or the like means that a particular feature, structure, and/or characteristic described in connection with a particular implementation and/or embodiment is included in at least one implementation and/or embodiment of claimed subject matter. Thus, appearances of such phrases, for example, in various places throughout this specification are not necessarily intended to refer to the same implementation or to any one particular implementation described. Furthermore, it is to be understood that particular features, structures, and/or characteristics described are capable of being combined in various ways in one or more implementations and, therefore, are within intended claim scope, for example. In general, of course, these and other issues vary with context. Therefore, particular context of description and/or usage provides helpful guidance regarding inferences to be drawn.

As utilized herein, the terms "coupled", "connected," and/or similar terms are used generically. It should be understood that these terms are not intended as synonyms. Rather, "connected" is used generically to indicate that two or more components, for example, are in direct physical, including electrical, contact; while, "coupled" is used generically to mean that two or more components are potentially in direct physical, including electrical, contact;

however, "coupled" is also used generically to also mean that two or more components are not necessarily in direct contact, but nonetheless are able to co-operate and/or interact. The term coupled is also understood generically to mean indirectly connected, for example, in an appropriate context.

The terms, "and", "or", "and/or" and/or similar terms, as used herein, include a variety of meanings that also are expected to depend at least in part upon the particular context in which such terms are used. Typically, "or" if used to associate a list, such as A, B or C, is intended to mean A, B, and C, here used in the inclusive sense, as well as A, B or C, here used in the exclusive sense. In addition, the term "one or more" and/or similar terms is used to describe any feature, structure, and/or characteristic in the singular and/or is also used to describe a plurality and/or some other combination of features, structures and/or characteristics. Likewise, the term "based on" and/or similar terms are understood as not necessarily intending to convey an exclusive set of factors, but to allow for existence of additional factors not necessarily expressly described. Of course, for all of the foregoing, particular context of description and/or usage provides helpful guidance regarding inferences to be drawn. It should be noted that the following description merely provides one or more illustrative examples and claimed subject matter is not limited to these one or more illustrative examples; however, again, particular context of description and/or usage provides helpful guidance regarding inferences to be drawn.

An aspect of the present technique discloses a reconfigurable circuit architecture comprising a configurable volatile storage circuit and Non-Volatile Memory (NVM) circuit elements; wherein the non-volatile memory circuit elements store multiple bit states for re-configuration, the multiple bit states being read from the non-volatile memory circuit elements and written into the configurable volatile storage circuit for reconfiguration, wherein the NVM circuit elements and the configurable volatile storage circuit are provided on a common die. The configurable volatile storage circuit may be implemented in FPGA logic, Programmable Logic Array (PLA) or Coarse Grained Reconfigurable Array (CGRA). The NVM circuit elements are provided in a layer co-located vertically or above on a die stack with a layer forming the volatile storage circuit. In such an arrangement the NVM circuit elements may be provided in a stack of metal layers over the layer forming the volatile storage circuit and the stack may be arranged so that it matches the footprint of access transistors disposed below the stack.

In embodiments, the NVM circuit elements may comprise an array of correlated electron switching elements. These may be multiple NVM circuit elements with multiple states and a configuration power gate for initiating a writing of a state into the configurable volatile storage circuit. The writing of a state into the configurable volatile storage circuit may be performed multiple times compared the writing of a state into the NVM circuit elements and after writing a state into the volatile storage circuit, the non-volatile memory elements are powered off. An output of the circuit may be connected to a multiplexer to select between entries in a look-up table.

Another aspect of present techniques provides a machine implemented method of reconfiguration comprising storing multiple bit states for reconfiguration in non-volatile memory circuit elements; reading the multiple bit states from the non-volatile memory circuit elements; and writing the multiple bit states into a configurable volatile storage circuit, wherein the non-volatile memory circuit elements and the configurable volatile storage circuit are provided on a common die. The method may include writing a state into the configurable volatile storage circuit multiple times compared to writing a state into the non-volatile memory circuit elements. Further the method may include powering off the non-volatile memory elements after writing a state into the volatile storage circuit. Further the method may include outputting a signal to a multiplexer for selecting entries in a look-up table.

Particular embodiments of the present disclosure incorporate correlated electron material (CEM) to form a correlated electron switch (CES) having application as a correlated electron random access memory (CERAM) in memory and/or logic devices which may be used with a wide range of electronic circuit types.

In this context, a CES may exhibit a substantially abrupt conductor/insulator transition arising from electron correlations rather than solid state structural phase changes (e.g., crystalline/amorphous in phase change memory (PCM) devices or filamentary formation and conduction in resistive RAM devices). In one embodiment, a substantially abrupt conductor/insulator transition in a CES may be responsive to a quantum mechanical phenomenon, in contrast to melting/solidification or filament formation, for example. As used herein, the terms "conductive state", "lower impedance state", and/or "metal state" may be interchangeable, and/or may at times be referred to as a "conductive/lower impedance state." Similarly, the terms "insulative state" and "higher impedance state" may be used interchangeably herein, and/or may at times be referred to as an "insulative/higher impedance state."

A quantum mechanical transition of correlated electron switch material between an insulative/higher impedance state and a conductive/lower impedance state may be understood in terms of a Mott transition. In a Mott transition, a material may switch from an insulative/higher impedance state to a conductive/lower impedance state if a Mott transition condition occurs. The Mott criteria is defined by $(n_c)^{1/3} a \approx 0.26$, where $n_c$ is a concentration of electrons and "a" is the Bohr radius. When a critical carrier concentration is achieved such that the Mott criteria is met, the Mott transition will occur and the state of the CES will change from a higher resistance/higher capacitance state (that is, an insulative/higher impedance state) to a lower resistance/lower capacitance state (that is, a conductive/lower impedance state).

The Mott transition may be controlled by a localization of electrons. When carriers are localized, the strong coulomb interaction between the electrons splits the bands of the CEM to create an insulator. When electrons are no longer localized, the weak coulomb interaction dominates and the band splitting is removed, resulting in a metal (conductive) band. This is sometimes explained as a "crowded elevator" phenomenon. While an elevator has only a few people in it, the people can move around easily, which is analogous to a conductive/lower impedance state. While the elevator reaches a certain concentration of people, on the other hand, the people can no longer move, which is analogous to the insulative/higher impedance state. However, it should be understood that this classical explanation provided for illustrative purposes, like all classical explanations of quantum phenomenon, is only an incomplete analogy, and that claimed subject matter is not limited in this respect.

Further, in an embodiment, switching from an insulative/higher impedance state to a conductive/lower impedance state may bring about a change in capacitance in addition to a change in resistance. For example, a CES may include the property of variable resistance together with the property of variable capacitance. That is, impedance characteristics of a CES device may include both resistive and capacitive components. For example, in a metal state, a CEM may have substantially zero electric field, and therefore substantially zero capacitance. Similarly, in an insulative/higher impedance state (in which electron screening may be very imperfect due to lower density of free electrons), an external electric field may be capable of penetrating the CEM and therefore the CEM will have capacitance due to a physical change in the dielectric function of the CEM. Thus, for example, a transition from an insulative/higher impedance state to a conductive/lower impedance state in a CES may result in changes in both resistance and capacitance, in an embodiment.

In an embodiment, a CES device may switch impedance states responsive to a Mott-transition in a majority of the volume of the CEM of a CES device. In an embodiment, a CES device may comprise a "bulk switch." As used herein, the term "bulk switch" refers to at least a majority volume of a CEM of a CES device switching impedance states, such as responsive to a Mott-transition. For example, in an embodiment, substantially all of a CEM of a CES device may switch from an insulative/higher impedance state to a conductive/lower impedance state or from a conductive/lower impedance state to an insulative/higher impedance state responsive to a Mott-transition. In an embodiment, a CEM may comprise one or more transition metal oxides (TMO), one or more rare earth oxides, one or more oxides of one or more f-block elements of the periodic table, one or more rare earth transitional metal oxide perovskites, yttrium, and/or ytterbium, although claimed subject matter is not limited in scope in this respect. In an embodiment, a device, such as CES device, may comprise CEM including one or more materials selected from a group comprising aluminum, cadmium, chromium, cobalt, copper, gold, iron, manganese, mercury, molybdenum, nickel, palladium, rhenium, ruthenium, silver, tin, titanium, vanadium, and zinc (which may be linked to a cation such as oxygen or other types of ligands), or combinations thereof, although claimed subject matter is not limited in scope in this respect.

FIG. 1A shows an example embodiment of a CES device 100 comprising CEM, such as material 102, sandwiched between conductive terminals, such as conductive terminals 101 and 103. In an embodiment, a CES device, such as CES device 100, may comprise a variable impeder device. As utilized herein, the terms "correlated electron switch" and "variable impeder" may be interchangeable. At least in part through application of a critical voltage and a critical current between the terminals, such as between conductive terminals 101 and 103, the CEM, such as material 102, may transition between the aforementioned conductive/lower impedance state and insulative/higher impedance state. As mentioned earlier, CEM, such as material 102, in a variable impeder device, such as CES device 100, may transition between a first impedance state and a second impedance state due to a quantum mechanical transition of the correlated electron switch material because of an applied critical voltage and an applied critical current, as described in more detail below. Also, as mentioned above, a variable impeder device, such as variable impeder device 100, may exhibit properties of both variable resistance and variable capacitance.

In a particular embodiment, a variable impeder device, such as CES device 100, may comprise a CEM that may transition between or among a plurality of detectable impedance states based, at least in part, on a transition of at least a majority portion of the CEM between an insulative/higher impedance state and a conductive/lower impedance state due to a quantum mechanical transition of the correlated electron switch material. For example, in an embodiment, a CES device may comprise a bulk switch, in that substantially all of a CEM of a CES device may switch from an insulative/higher impedance state to a conductive/lower impedance state or from a conductive/lower impedance state to an insulative/higher impedance state responsive to a Mott-transition. In this context, an "impedance state" means a detectable state of a variable impeder device that is indicative of a value, symbol, parameter and/or condition, just to provide a few examples. In one particular embodiment, as described below, an impedance state of a CES device may be detected based, at least in part, on a signal detected on terminals of the CES device in a read and/or sense operation. In another particular embodiment, as described below, a CES device may be placed in a particular impedance state to represent or store a particular value, symbol, and/or parameter, and/or to achieve a particular capacitance value for the CES device by application of one or more signals across terminals of the CES device in a "write" and/or "program" operation, for example. Of course, claimed subject matter is not limited in scope to the particular example embodiments described herein.

Figure 1B:
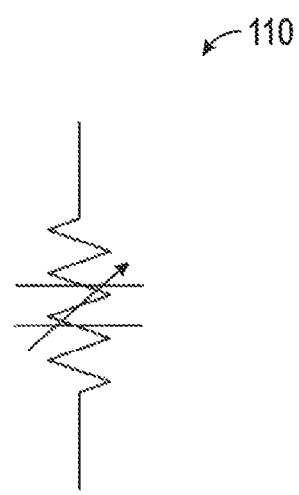
FIG. 1B is an example symbol for a correlated electron switch.

FIG. 1B depicts an example symbol 110 that may be utilized, for example, in electrical circuit schematic diagrams to notate a CES/variable impeder device. Example symbol 110 is meant to remind the viewer of the variable resistance and variable capacitance properties of a CES/variable impeder device, such as CES device 100. Example symbol 110 is not meant to represent an actual circuit diagram, but is merely meant as an electrical circuit diagram symbol. Of course, claimed subject matter is not limited in scope in these respects.

Figure 2:
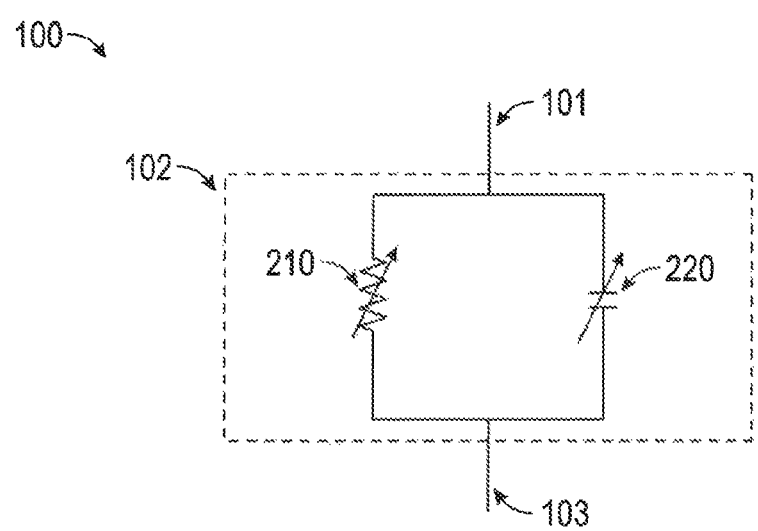
FIG. 2 is an example equivalent circuit for a correlated electron switch.

FIG. 2 depicts a schematic diagram of an equivalent circuit of an example CES/variable impeder device, such as CES device 100. As mentioned, a CES/variable impeder device may comprise characteristics of both variable resistance and variable capacitance. That is, the impedance characteristics of a CES/variable impeder device, such as CES device 100, may depend at least in part on the resistance and capacitance characteristics of the device. For example, an equivalent circuit for a variable impeder device may, in an embodiment, comprise a variable resistor, such as variable resistor 210 in parallel with a variable capacitor, such as variable capacitor 220. Of course, although a variable resistor 210 and variable capacitor 220 are depicted in FIG. 2 as comprising discrete components, a variable impeder device, such as CES 100, may comprise a substantially homogenous CEM, such as CEM 102, wherein the CEM comprises characteristics of variable capacitance and variable resistance.

Table 1 below depicts an example truth table for an example variable impeder device, such as CES device 100.

TABLE 1

Correlated Electron Switch Truth Table

| Resistance | Capacitance | Impedance |
| --- | --- | --- |
| $R_{high}(V_{applied})$ | $C_{high}(V_{applied})$ | $Z_{high}(V_{applied})$ |
| $R_{low}(V_{applied})$ | $C_{low}(V_{applied}) \sim 0$ | $Z_{low}(V_{applied})$ |

In an embodiment, the example truth table shown in Table 1 shows that a resistance of a variable impeder device, such as CES device 100, may transition between a lower resistance state and a higher resistance state that is a function, at least in part, of a voltage applied across the CEM. In an embodiment, a resistance of a lower resistance state may be 10 to 100,000 times lower than a resistance of a higher resistance state, although claimed subject matter is not limited in scope in this respect. Similarly, Table 1 shows that a capacitance of a variable impeder device, such as CES device 100, may transition between a lower capacitance state, which for an example embodiment may comprise approximately zero, or very little, capacitance, and a higher capacitance state that is a function, at least in part, of a voltage applied across the CEM. Also, as shown in Table 1, a variable impeder device's transition from a higher resistance/higher capacitance state to a lower resistance/lower capacitance state may be represented as a transition from a higher impedance state to a lower impedance state. Similarly, a transition from a lower resistance/lower capacitance state to a higher resistance/higher capacitance state may be represented as a transition from a lower impedance state to a higher impedance state.

It should be noted that a variable impeder, such as CES 100, is not a resistor, but rather comprises a device having properties of both variable capacitance and variable resistance. In an embodiment, resistance and/or capacitance values, and therefore impedance values, depend, at least in part, on an applied voltage.

Figure 3:
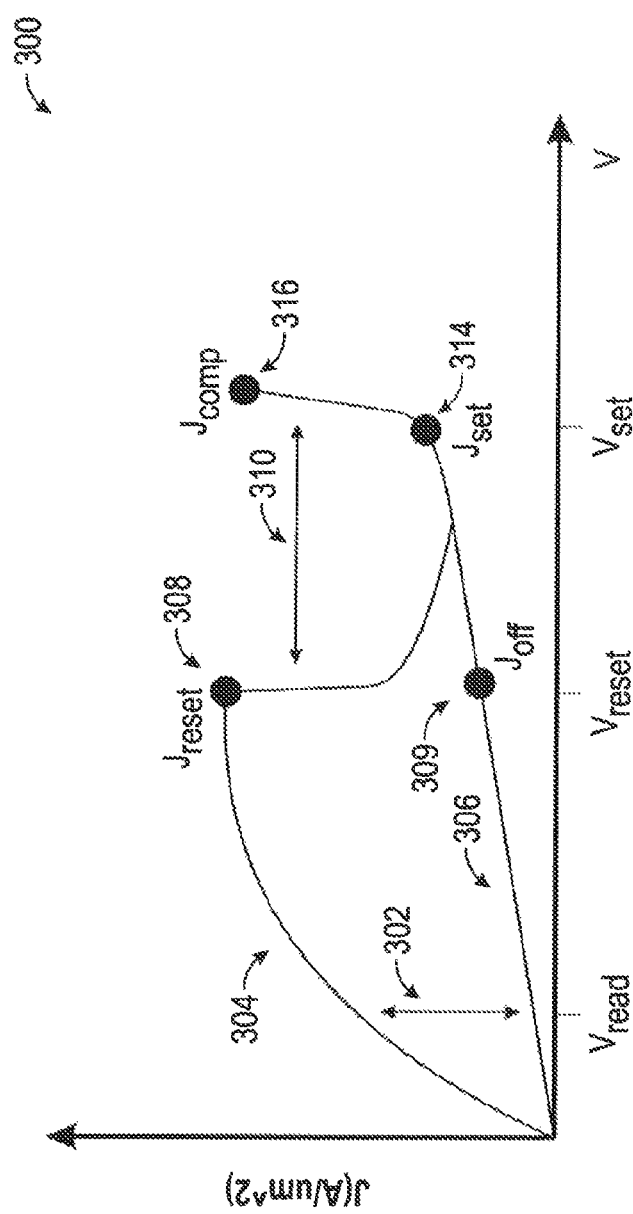
FIG. 3 shows an example plot of current density against voltage for a correlated electron switch.

FIG. 3 shows a plot of current density against voltage across electrically conductive terminals, such as electrically conductive terminals 101 and 103, of a CES device, such as example CES device 100, according to an embodiment. Based, at least in part, on a voltage applied to terminals of a variable impeder device (e.g., in a write operation), such as variable impeder device 100, a CEM, such as CEM 102, may be placed in a conductive/lower impedance state or an insulative/higher impedance state. For example, application of a voltage $V_{reset}$ and current density $J_{reset}$ may place the CES device in an insulative/higher impedance state, and application of a voltage $V_{set}$ and a current density $J_{set}$ may place the CES device in a conductive/lower impedance state. That is, a "set" condition may place a variable impeder device, such as CES device 100, into a conductive/lower impedance state, and a "reset" condition may place a variable impeder device, such as CES device 100, into an insulative/higher impedance state, in an embodiment. Following placement of the CES device in a lower impedance state or a higher impedance state, the particular state of the CES device may be detected at least in part by application of a voltage $V_{read}$ (e.g., in a read operation) and detection of a current or current density at terminals, such as electrically conductive terminals 101 and 103, of a variable impeder device, such as CES device 100.

In an embodiment, a CEM of a CES device may include, for example, any transition metal oxide (TMO), such as, for example, peroskovites, Mott insulators, charge exchange insulators, and/or Anderson disorder insulators. In a particular embodiment, a CES device may be formed from materials such as nickel oxide, cobalt oxide, iron oxide, yttrium oxide and peroskovites such as Cr doped strontium titanate, lanthanum titanate, and the manganite family including praesydium calcium manganite, and praesydium lanthanum manganite, to provide a few examples. In an embodiment, oxides incorporating elements with incomplete d and f orbital shells may exhibit sufficient impedance switching properties for use in a CES device. In an embodiment, a CES may be prepared without electroforming. Other embodiments may employ other transition metal compounds without deviating from claimed subject matter. For example, {M(chxn)$_2$Br}Br$_2$ where M may comprise Pt, Pd, or Ni, and chxn comprises 1R,2R-cyclohexanediamine, and other such metal complexes may be used without deviating from the scope of claimed subject matter.

In one embodiment, the CES device of FIG. 1A may comprise materials that comprise TMO variable impedance materials, though it should be understood that these are exemplary only, and are not intended to limit the scope of claimed subject matter. Particular implementations may employ other variable impedance materials as well. Nickel oxide, NiO, is disclosed as one particular TMO. NiO materials discussed herein may be doped with extrinsic ligands, which may stabilize variable impedance properties by passivating the interfacing and allowing for adjustable voltages and impedances, in an embodiment. In a particular embodiment, NiO variable impedance materials disclosed herein may include a carbon containing ligand, which may be indicated by NiO(C$_x$). Here, one skilled in the art may determine a value of x for any specific carbon containing ligand and any specific combination of carbon containing ligand with NiO simply by balancing valences, in an embodiment. In another particular example embodiment, NiO doped with extrinsic ligands may be expressed as NiO(L$_x$), where L$_x$ is a ligand element or compound and x indicates a number of units of the ligand for one unit of NiO. One skilled in the art may determine a value of x for any specific ligand and any specific combination of ligand with NiO or any other transition metal simply by balancing valences, in an embodiment.

According to an embodiment, if sufficient bias is applied (e.g., exceeding a band-splitting potential) and the aforementioned Mott condition is met (injected electron holes=the electrons in the switching region), the CES device may rapidly switch from a conductive/lower impedance state to an insulator state via the Mott transition. This may occur at point 308 of the plot in FIG. 3. At this point, electrons are no longer screened and become localized. This correlation splits the bands to form an insulator. While the CEM of the CES device is still in the insulative/higher impedance state, current may generated by transportation of holes. If enough bias is applied across terminals of the CES device, electrons may be injected into a metal-insulator-metal (MIM) diode over the potential barrier of the MIM device. If enough electrons have been injected and enough potential is applied across terminals to achieve a set condition, an increase in electrons may screen electrons and remove a localization of electrons, which may collapse the band-splitting potential forming a metal, thereby placing the CES device in a conductive/lower impedance state.

As pointed out above, a transition to an insulative/higher impedance state may occur in response to a Mott transition at point 308. As pointed out above, such a Mott transition may occur at a condition in a CEM of a CES device in which a concentration of electrons n equals a concentration of electron holes p. This condition occurs when the following Mott criteria is met, as represented by expression (1) as follows:

$$\lambda_{TF} n^{\frac{1}{3}} = C \sim 0.26 \qquad (1)$$

$$n = \left(\frac{C}{\lambda_{TF}}\right)^3$$

where: $\lambda_{TF}$ is a Thomas Fermi screening length; and C is a constant which equals approximately 0.26 for the Mott transition.

According to an embodiment, a current or current density in a region 304 of the plot shown in FIG. 3 may exist in response to an injection of holes from a voltage signal applied across terminals, such as terminals 101 and 103, of a variable impeder device, such as CES device 100. Here, injection of holes may meet a Mott transition criterion for the conductive to insulator transition at current $I_{MI}$ as a critical voltage $V_{MI}$ is applied across terminals, such as terminal 101 and 103, of a variable impeder device, such as CES device 100. This may be modeled according to expression (2) as follows:

$$I_{MI}(V_{MI}) = \frac{dQ(V_{MI})}{dt} \approx \frac{Q(V_{MI})}{t} \quad (2)$$

$$Q(V_{MI}) = qn(V_{MI})$$

where $Q(V_{MI})$ is the charge injected (hole or electron) and is a function of the applied voltage. As used herein, the notation "MI" signifies a metal-to-insulator transition, and the notation "IM" signifies an insulator-metal transition. That is, "$V_{MI}$" refers to a critical voltage and "$I_{MI}$" refers to a critical current to transition a CEM from a conductive/lower impedance state to an insulative/higher impedance state. Similarly, "VIM" refers to a critical voltage and "IIM" refers to a critical current to transition a CEM from an insulative/higher impedance state to a conductive/lower impedance state.

Injection of holes to enable a Mott transition may occur between bands and in response to critical voltage $V_{MI}$ and critical current $I_{MI}$. By equating electron concentration n with the needed charge concentration to result in a Mott transition by holes injected by $I_{MI}$ in expression (2) according to expression (1), a dependency of such a critical voltage $V_{MI}$ on Thomas Fermi screening length $\lambda_{TF}$ may be modeled according to expression (3) as follows:

$$I_{MI}(V_{MI}) = \frac{Q(V_{MI})}{t} = \frac{qn(V_{MI})}{t} = \frac{q}{t}\left(\frac{C}{\lambda_{TF}}\right)^3 \quad (3)$$

$$J_{reset}(V_{MI}) = J_{MI}(V_{MI}) = \frac{I_{MI}(V_{MI})}{A_{CEM}} = \frac{q}{A_{CEM}t}\left(\frac{C}{\lambda_{TF}}\right)^3$$

wherein $A_{CEM}$ is a cross-sectional area of a CEM, such as CEM 102, of a variable impeder device, such as CES device 100, and wherein $J_{reset}(V_{MI})$, depicted at point 308 of example plot 300, is a current density through the CEM, such as CEM 102, to be applied to the CEM at a critical voltage $V_{MI}$ to place the CEM of the CES device in an insulative/higher impedance state. In an embodiment, a CEM may be switched between a conductive/lower impedance state and an insulative/higher impedance state at least in part by a disproportionation reaction.

According to an embodiment, a CEM, such as CEM 102, of a variable impeder device, such as CES device 100, may be placed in a conductive/lower impedance state (e.g., by transitioning from an insulative/higher impedance state) by injection of a sufficient number of electrons to satisfy a Mott transition criteria.

In transitioning a CEM of a CES device to a conductive/lower impedance state, as enough electrons have been injected and the potential across terminals of the variable impeder device overcomes a critical switching potential (e.g., $V_{set}$), injected electrons begin to screen and unlocalize double-occupied electrons to reverse a disproportion reaction and closing the bandgap. A current density $J_{set}$(VIM), depicted at point 314 of FIG. 3, for transitioning the CEM of the CES device to the conductive/lower impedance state in a metal-insulator Mott transition at a critical voltage VIM enabling transition to the conductive/lower impedance state may be represented according to expressions (4) as follows:

$$I_{IM}(V_{IM}) = \frac{dQ(V_{IM})}{dt} \approx \frac{Q(V_{IM})}{t} \quad (4)$$

$$Q(V_{IM}) = qn(V_{IM})$$

$$I_{IM}(V_{IM}) = \frac{Q(V_{IM})}{t} = \frac{qn(V_{IM})}{t} = \frac{q}{t}\left(\frac{C}{a_B}\right)^3$$

$$J_{set}(V_{IM}) = J_{injection}(V_{IM}) = J_{IM}(V_{IM}) = \frac{I_{IM}(V_{IM})}{A_{CEM}} = \frac{q}{A_{CEM}t}\left(\frac{C}{a_B}\right)^3$$

where: $a_B$ is a Bohr radius.

According to an embodiment, a "read window" 302 for detecting a memory state of a CES device in a read operation may be set out as a difference between a portion 306 the plot of FIG. 3 while the CEM of the CES device is in an insulative/higher impedance state and a portion 304 of the plot FIG. 3 while the CEM of the CES device is in a conductive/lower impedance state at a read voltage $V_{read}$. In a particular implementation, read window 302 may be used to determine the Thomas Fermi screening length $\lambda_{TF}$ of a CEM, such as correlated electron switch material 102, of a variable impeder device, such as CES device 100. For example, at a voltage $V_{reset}$, current densities $J_{reset}$ and $J_{set}$ may be related to according to expression (4a) as follows:

$$\lambda_{TF}(@V_{reset}) = a_B\left(\frac{J_{reset}}{J_{off}}\right)^{\frac{1}{3}} \quad (4a)$$

wherein $J_{off}$ represents a current density of a CEM in an insulative/higher impedance state at $V_{reset}$. See, for example, point 309 of FIG. 3.

In another embodiment, a "write window" 310 for placing a CEM of CES device in an insulative/higher impedance or conductive/lower impedance state in a write operation may be set out as a difference between $V_{reset}$ and $V_{set}$. Establishing $|V_{set}|>|V_{reset}|$ may enable a switch between the conductive/lower impedance and insulative/higher impedance state. $V_{reset}$ may comprise approximately the band splitting potential caused by the correlation and $V_{set}$ may comprise approximately twice the band splitting potential, such that the read window may comprise approximately the band-splitting potential. In particular implementations, a size of write window 310 may be determined, at least in part, by materials and doping of the CEM of the CES device.

In an embodiment, a process for reading a value represented as an impedance state of a variable impeder device, such as CES device 100, may comprise a voltage being applied to a CEM of a CES device. At least one of a current and/or current density within a CEM of a CES device may be measured, and an impedance state of a CEM of a CES device may be determined, at least in part, on the measured current and/or current density, in an embodiment.

Additionally, in an embodiment, an impedance of an impedance state may depend at least in part on a combination of a capacitance and a resistance of a CEM of a CES device. In an embodiment, the determined impedance state may comprise one of a plurality of impedance states. A first impedance state may comprise a lower resistance and lower capacitance, and a second impedance state may comprise a higher resistance and a higher capacitance, for example. Also, in an embodiment, a ratio of the impedances of the plurality of impedance states may be proportional to a physical property of the CEM of the CES device. In an embodiment, the physical property of the CEM of the CES device may comprise at least one of a Thomas Fermi screening length and a Bohr radius. Further, in an embodiment, individual impedance states of the plurality of impedance states may be associated with a data value. Additionally, in an embodiment, a difference in current between a first impedance state and a second impedance state at a predetermined voltage provides an indication of a read window. However, claimed subject matter is not limited in scope in these respects.

In an embodiment, a plurality of electrons may be provided to a CEM of a CES device such that the CES enters a first impedance state. A plurality of holes may be provided to the CEM such that the CES enters a second impedance state. Also, in an embodiment, the plurality of electrons may cause a voltage across the CES to be greater than a set voltage threshold, and the plurality of holes may cause the voltage across the CES to be equal to or greater than a reset voltage threshold. Further, in an embodiment, a voltage across the CEM may cause a current density in the CEM to be equal to or greater than a set current density and/or a set current, and a voltage across the CEM may cause a current density in the CEM to be equal to or greater than a reset current density and/or a reset current.

Also, in an embodiment, a set voltage across the CEM and a set current density through a CEM of a CES device may be exceeded. Additionally, a reset voltage across a CEM and a reset current density through a CEM of a CES device may be exceeded. Further, in an embodiment, individual impedance states of a plurality of impedance states may be associated with a data value.

In an embodiment, at least one of a reset voltage, a set voltage, and a difference between the set voltage and the reset voltage are proportional to a physical property of a CEM of a CES device. A physical property of a CEM may include at least one of a strong electron potential due to localization, and/or a correlation of electrons, for example. Also, in an embodiment, a difference in the set voltage and the reset voltage may provide an indication of a size of at least one of a write/program window.

Figure 4:
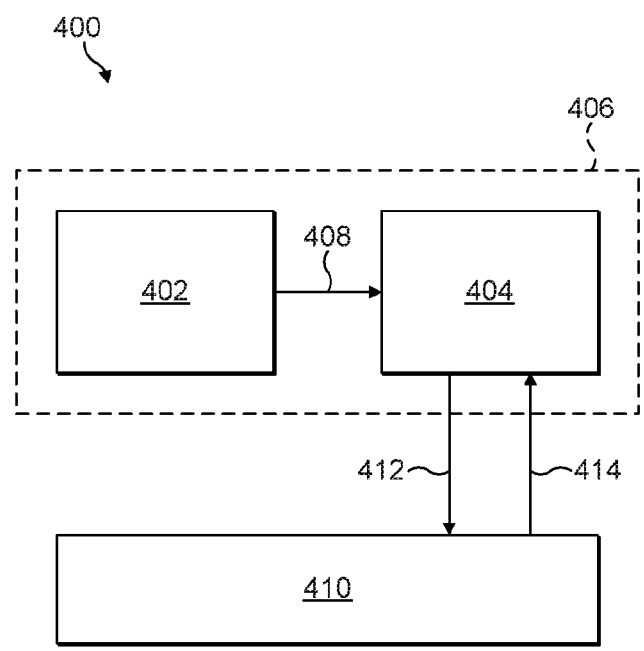
FIG. 4 is a schematic diagram of a reconfigurable circuit architecture in accordance with an embodiment.

FIG. 4 is a schematic diagram of a reconfigurable circuit architecture 400 in accordance with an embodiment comprising a Non-Volatile Storage module 402 co-located and fabricated on a common die 406 with a Volatile memory module 404. The Non-volatile storage module 402 is connected to the Volatile memory module 404 by electrical connections 408. A configurable fabric module 410 is connected to the Volatile memory module 404 by input electrical connections 412 and output electrical connections 414.

Present techniques that are described employ a way of using a stack of CeRAM (Correlated-electron Random Access Memory) cells in the metal layers above regular FPGA or CGRA logic to store multiple configurations, and an energy-efficient system for reloading the active configuration bits at runtime.

So in the example of an IoT edge node, one can envision running only the barebones (minimal) configuration to save power but then quickly powering up the CeRAM layer(s), reloading the SRAM cells, and then running other configurations if an alternative or, perhaps, some more advanced functionality is desired. In embodiments, the CeRAM can be powered up only for the purpose of programming the volatile memory and not for the entire duration of operation.

Present techniques are also applicable to a common problem encountered in Cloud frameworks which incorporate accelerators. Virtualisation of resources is beneficial in Cloud environments because it enables dynamic provisioning and the maximisation of utilisation. However, fixed-function accelerators do not enable service providers to reclaim the physical device area for other uses when there are I/O or other delays.

Virtualisation of accelerators in the Cloud can be possible with our invention because several applications could dynamically share the accelerator fabric whilst running simultaneously and using different configurations. This can optimise the total cost of ownership (TCO).

Although it is possible to build the configuration storage in FPGAs entirely out of CeRAM cells, we chose to retain SRAM cells in the reconfigurable fabric because SRAM has better endurance properties than CeRAM. In embodiments, SRAM is overwritten multiple times, whereas CeRAM is overwritten fewer times than SRAM. This writing arrangement combined with the higher endurance of SRAM over CeRAM helps to improve the overall endurance of the system. In general, SRAM could be used for parts of the design that need many updates. More specifically, looking at the circuit shown in FIG. 6, it can also be seen that by staging the memory update, the storage circuit can consume less power overall because there is no path between Vdd and ground in any logic state that the hybridised SRAM cell holds. On the other hand, the CeRAM circuit will have a path (with current flowing) between Vdd and ground when its resistor is in the ON or low-resistance state. In addition, we envision performing some wear-levelling as the fabric is updated: so different parts of the fabric will have roughly the same number of backed-up configurations.

The non-volatility of CeRAM can save power when used to store multiple configurations because the back-up inactive configurations can be powered down when one configuration is selected and loaded into SRAM.

The CeRAM memory element is smaller than a 6T SRAM cell (including programming and read circuitry).

Reconfiguration on the fly is provided according to present techniques. Multiple non-volatile memory elements may write their state into the SRAM-based volatile memory. After writing their state into the SRAM-based volatile memory the non-volatile memory elements may be powered off. Alternative approaches for virtualising the FPGA resource would almost invariably end up with bigger FPGAs or require multiple FPGAs. Apart from the obvious space disadvantage, having multiple FPGAs is also problematic because the concomitant I/O resources generally consume a lot of energy.

Figure 5:
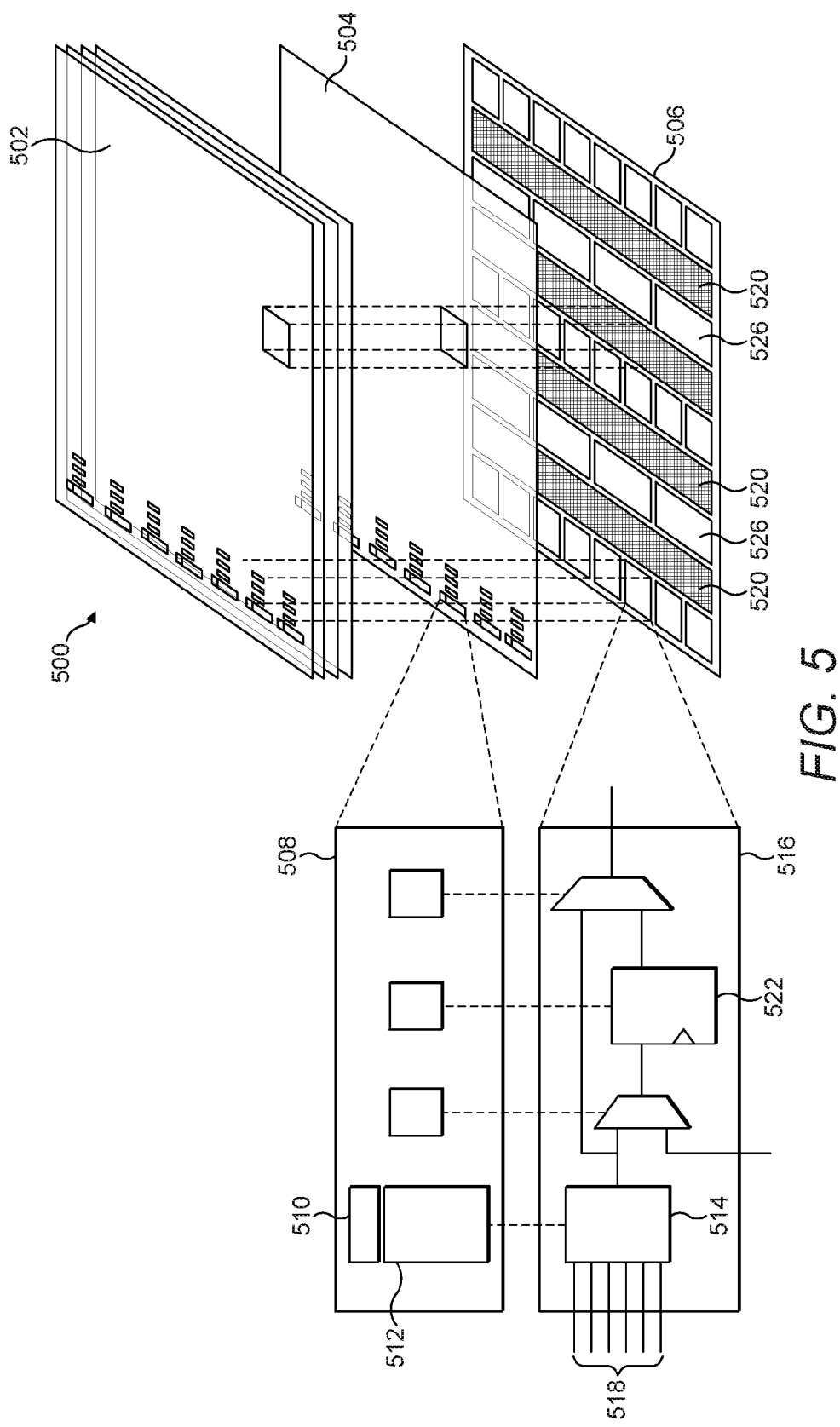
FIG. 5 is a schematic diagram of a reconfigurable circuit architecture in accordance with an embodiment.

FIG. 5 is a schematic diagram of a reconfigurable circuit architecture 500 in accordance with an embodiment. The reconfigurable circuit architecture 500 comprises non-volatile memory layer 502 storing multiple configurations, volatile memory layer 504 having active circuit configurations and configurable hardware layer 506 having active logic circuits.

A configuration data store 508 is shown in more detail and comprises func. 510 and content module 512 connected to a Lookup Table 514 forming part of a logic block 516 disposed on the configurable hardware layer 506. Input array 518 is connected to the Lookup Table 514 from routing 520. The logic block 516 further comprises logic module 522 providing components such as multiplexer, flip-flop and glue-logic (all not shown in FIG. 5).

In addition to logic block 516 and routing 520 the configurable hardware layer 506 also comprises memory blocks 524 and hardware blocks 526 such as digital signal processing hardware.

Figure 6:
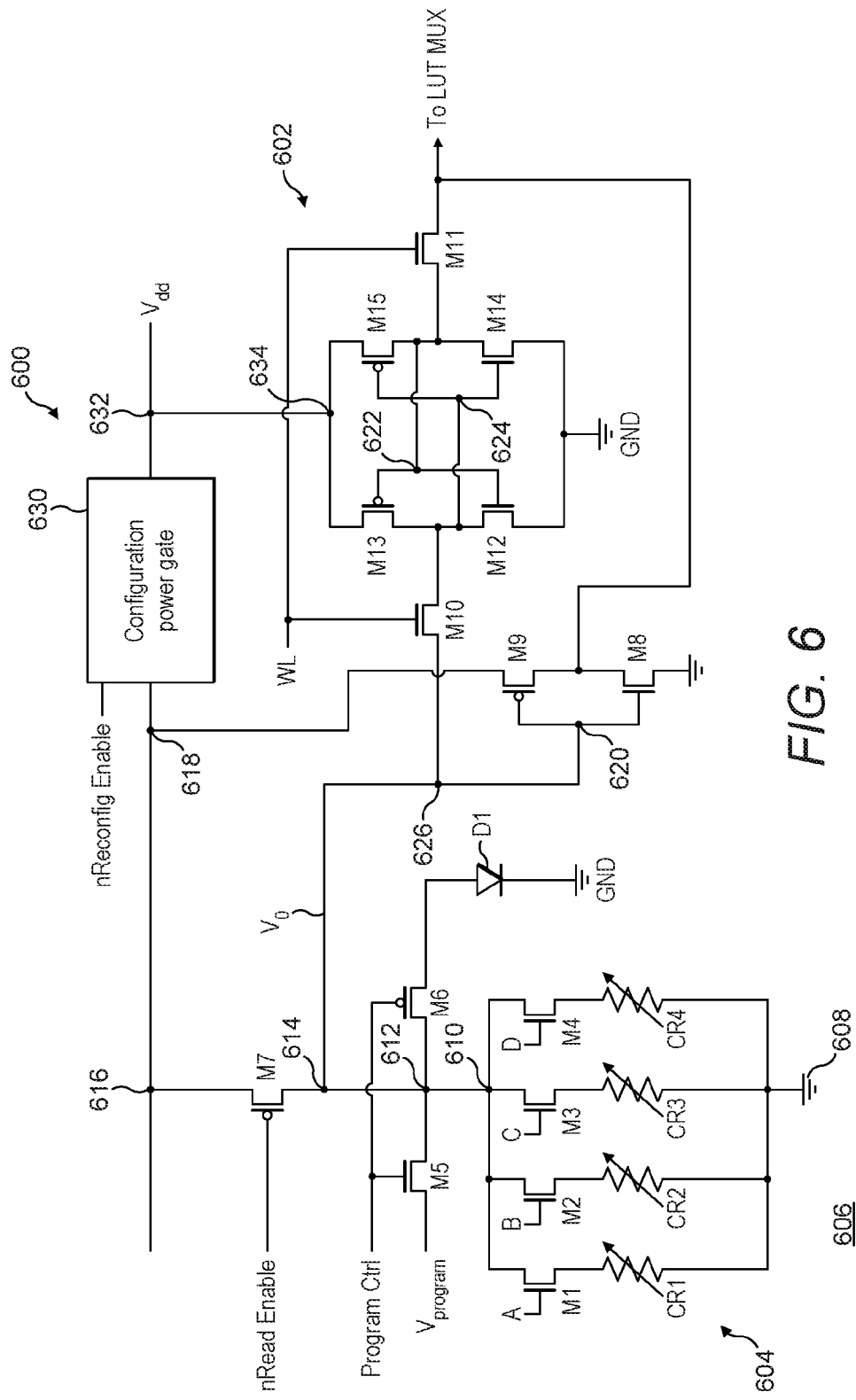
FIG. 6 is a schematic diagram of a reconfiguration circuit with SRAM and CeRAM cells in accordance with an embodiment.

FIG. 6 is a schematic diagram of a reconfiguration circuit 600 with SRAM 602 and CeRAM 604 cells in accordance with an embodiment.

Referring to FIG. 6, a Non-Volatile memory module 606 comprises an array of four CeRAM devices CR1, CR2, CR3 and CR4 connected in parallel each having at one electrode a connection to a ground terminal 608. Each of the CeRAM devices CR1, CR2, CR3 and CR4 has a second electrode connected to the drain terminal of a respective n-channel access transistor M1, M2, M3 and M4 such that CR1 is connected to M1, CR2 is connected to M2, CR3 is connected to M3 and CR4 is connected to M4. Each access transistor, M1, M2, M3 and M4 comprises a gate terminal connected to a respective control input A, B, C, D such that M1 is connected to control input A, M2 to B, M3 to C and M4 to D. Each access transistor, M1, M2, M3 and M4 comprises a source terminal connected to node 610.

Node 610 is connected to node 612 which is connected to n-channel transistor M5 and p-channel transistor M6. The p-channel transistor M6 is connected to anode terminal of diode D1 which has a cathode terminal connected to ground and the n-channel transistor M5 is connected to Vprogram input to receive either a SET of RESET voltage as described in more detail in connection with the operation of the reconfiguration circuit 600 below. Gate terminal of the n-channel transistor M5 and gate terminal of the p-channel transistor M6 are connected to Program Ctrl input set in operation to either a HIGH or LOW state as described in more detail in connection with the operation of the reconfiguration circuit 600 below.

Node 612 is connected to node 614 which is connected to p-channel transistor M7 having a gate terminal connected to a nRead Enable input set in operation to either a HIGH or LOW state as described in more detail in connection with the operation of the reconfiguration circuit 600 below. P-channel transistor M7 is connected to supply voltage rail Vdd at node 616. Node 618 on supply rail Vdd is connected to p-channel transistor M9 connected in series to n-channel transistor M8 connected to ground GND. A gate terminal of both the p-channel transistor M9 and n-channel transistor M8 are connected to node 620 which is connected back to node 614.

A volatile memory module comprises SRAM 602 such as a latch circuit comprising a six transistor (6T) SRAM memory cell 602 as may be used in an SRAM memory system. The 6T memory cell 602 comprises two p-channel transistors M13, M15 and two n-channel transistors M12 and M14. A node 622 is provided between M13 and M12, and similarly a node 624 is provided between M15 and M14. In use, the two sets of transistors M13, M12 and M15, M14 are cross-coupled inverters forming a bistable device capable of storing binary information having both read and write capabilities. A first state can be configured when the node 622 is at ground potential (GND) and the node 624 is at supply voltage Vdd. A second state can be configured when the node 624 is at the supply potential Vdd and the node 622 is at the ground potential (GND). N-channel pass transistor M10 is connected between M13 and M12 and node 626 which is connected between node 614 and node 620. A gate terminal of M10 is connected to a word line WL connected to a gate terminal of n-channel transistor M11 connected between M14 and M15 and connected to a Lookup Table multiplexer as described in more detail in connection with the operation of the reconfiguration circuit 600 below. M11 is also connected to a node 628 provided between M8 and M9.

The supply voltage rail Vdd comprises a configuration power gate 630 having input nReconfig Enable and node 632 connected to node 634 provided between M13 and M15.

In operation of the reconfiguration circuit 600, connections are made between the four appropriately sandwiched CeRAM devices (CR1, CR2, CR3, and CR4) and both programming and read circuitry. The output of the circuit 600 can be fed directly into a multiplexer which selects between entries in an FPGA's look-up table (LUT). FPGAs typically use 4- to 6-input LUTs and form connections between blocks containing these look-up tables to implement arbitrary logic. Each look-up table effectively instantiates a Boolean array or truth-table which can capture any function of 4 to 6 inputs.

Figure 7:
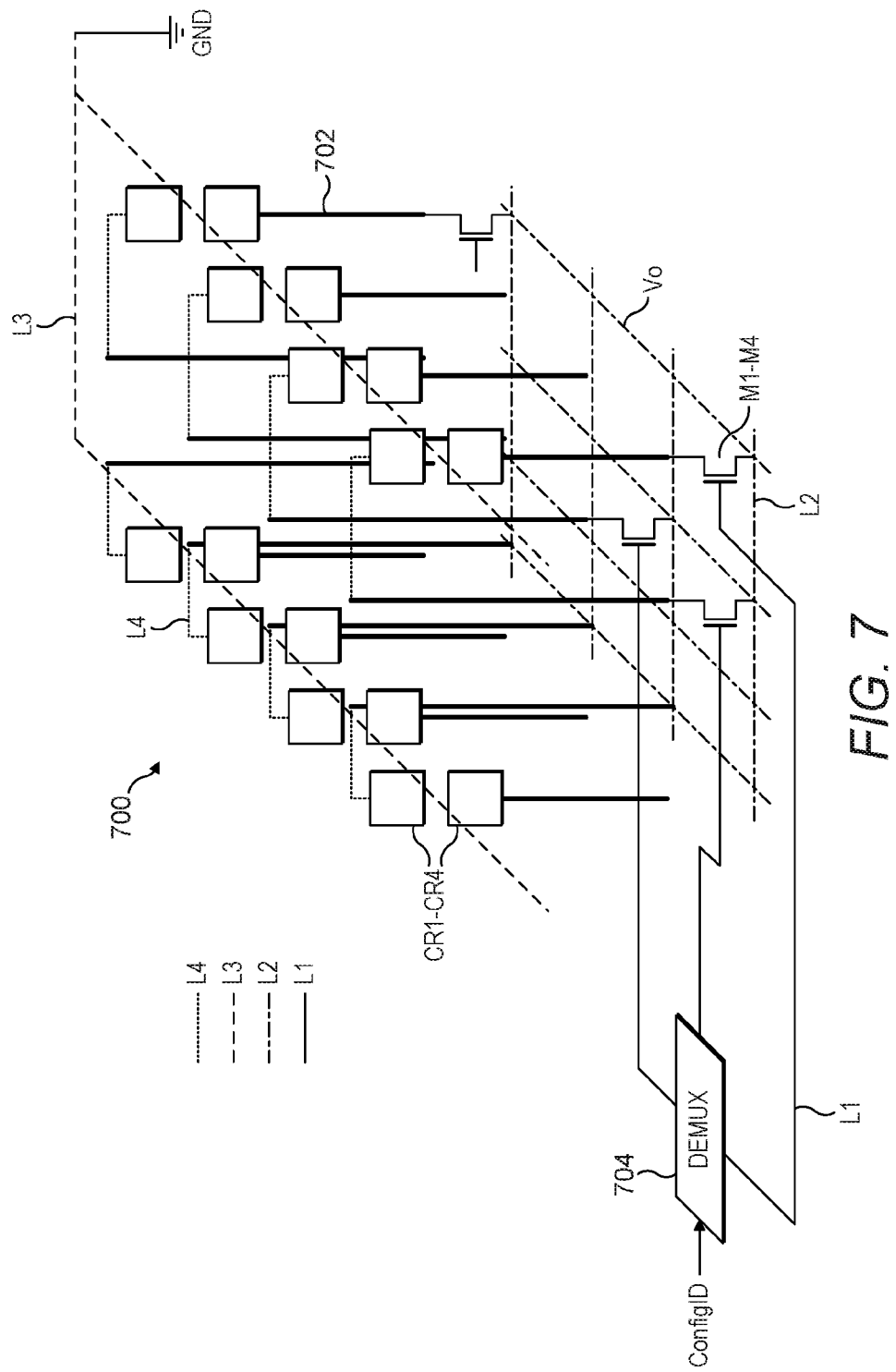
FIG. 7 is a schematic diagram of a three-dimensional circuit architecture of a reconfigurable memory in accordance with an embodiment.

In order to program CR2, for example, we can use the following sequence:
1) Assert nReconfigEnable so that the reconfiguration cache block which is normally powered down during regular operation is powered up.
2) Set nReadEnable to HIGH
3) Set WL to LOW
4) Setup Vprogram with either the SET or RESET voltage. The actual values are determined by the CeRAM device parameters and normally Vset>Vreset. The write margin (Vset−Vreset) is taken from a CeRAM device's hysteresis (IV) curve and this is derived from the physical construction of the device.
5) Select (isolate) CR2 by setting B to HIGH and A, C, and D to LOW. The selector control signals for the access transistors M1, M2, M3, and M4 can be derived from a demultiplexer 704 as shown in FIG. 7.
6) Set ProgramCtrl to HIGH
7) If Vprogram is high enough (Vset) then the CeRAM resistor CR2 ends up in a low impedance state. Otherwise, if the voltage is lower, Vreset, then CR2 ends up in a high impedance state. Note that if the CeRAM device is already ON (low resistance) then applying a Vset pulse has no effect, and, similarly, if it is already OFF (high resistance), then a Vreset pulse has no effect.
8) Set ProgramCtrl to LOW
9) De-assert nReconfigEnable so that the reconfiguration cache block is powered down until the next configuration reload or reprogram cycle.

In order to read CR2, for example, we can use the following sequence:
1) Assert nReconfigEnable so that the reconfiguration cache block which is normally powered down during regular operation is powered up.
2) Set ProgramCtr/to LOW
3) Set nReadEnable to LOW
4) Select (isolate) CR2 by setting B to HIGH and A, C, and D to LOW. The selector control signals for the access transistors M1, M2, M3, and M4 can be derived from a demultiplexer 704 as shown in FIG. 7
5) Set WL to HIGH
6) CR2 would have retained its state through the power cycle.

Note that the read margin is the resistance difference observed when the device is probed at a sufficiently low voltage, that is, less than Vreset. Thus programming or reading the ceRAM device should happen at different bias points or voltage regimes.

So, if CR2 is in a low impedance state (ON) then Vo is pulled closer to ground. M6 will be on and D1 will develop a very low potential difference (hence it will exhibit a high impedance). When Vo~0 is fed to the next stage, the cross-coupled 6-transistor SRAM cell stores a logic "1". If, on the other hand, CR2 is in a high impedance state (OFF) then Vo is pulled closer to Vdd. Note that it is undesirable for the value of Vo to become too high because that would, depending on the exact level, "reset" or "set" CR2.

The purpose of D1 is to put a strong limit on the voltage across CR2 since the semiconductor junction bias voltage is enforced when Vo starts to rise. D1 develops a lower impedance than before and subsequently takes current off the path through CR2. Since Vo does not reach the full rail voltage, the transistors M8 and M9 are designed so that their threshold voltages are low enough to compensate for this. That is, given Vo of say around 0.6V, M8 switches on and M9 switches off. Correspondingly, M13 switches on and M12 switches off causing a potential difference to appear across the drain and source of M10.

By carefully designing the pass transistor M10 so that such a Vds does not knock it off its standard operating point, we can avoid introducing more transistors to correct the imbalance. Consequently, the cross-coupled 6-transistor SRAM cell stores a logic "0" in this case.

7) De-assert WL
8) Set nReadEnable to HIGH
9) De-assert nReconfigEnable so that the reconfiguration cache block is powered down until the next configuration reload or reprogram cycle.

FIG. 7 is a schematic diagram of a three-dimensional circuit architecture 700 of the reconfigurable memory 600 in accordance with an embodiment. FIG. 7 illustrates the reconfigurable circuit 600 of FIG. 6 to create a fabric in three-dimensions in a manner which reduces the total number transistors per bit relative to conventional approaches using SRAM technology. The stacks and vias are arranged so that they match the footprint of the access transistors M1-M4 below metal layers L1, L2, L3 and L4. Present techniques yield a much higher bit density for reconfigurable storage than the conventional approach. In addition, the close proximity of secondary passive (attendant) configurations to the primary region where they are required makes reloading or activating new configurations particularly fast.

Note that FIG. 7 shows how two layers of transition metal-oxides such as CeRAM elements CR1, CR2, CR3 and CR4 are stacked advantageously, an approach that is currently feasible without incurring disproportionately high manufacturing costs in conventional fabrication processes or violating circuit design rules. Present techniques can also be generalised and extended to even more metal layers. In addition, the cross-talk and/or electrical loading issues in the Vo metal plane (see FIG. 6 and FIG. 7), and the relevant circuit design rules governing the density of vias 702, might discourage too many extra layers.

The invention claimed is:

1. A reconfigurable circuit architecture, comprising:
a configurable volatile storage circuit and an array of correlated electron switching elements;
wherein the correlated electron switching elements store data for re-configuration, the data being read from the correlated electron switching elements and written into the configurable volatile storage circuit for reconfiguration, and
wherein the correlated electron switching elements and the configurable volatile storage circuit are fabricated on a single die.

2. The reconfigurable circuit architecture as claimed in claim 1, wherein the configurable volatile storage circuit is implemented in FPGA logic, Programmable Logic Array (PLA) or Coarse Grained Reconfigurable Array (CGRA).

3. The reconfigurable circuit architecture as claimed in claim 1, wherein the correlated electron switching elements are provided in a layer co-located vertically on a die stack with a layer forming the configurable volatile storage circuit.

4. The reconfigurable circuit architecture as claimed in claim 3, wherein the correlated electron switching elements are provided in a stack of metal layers over the layer forming the configurable volatile storage circuit.

5. The reconfigurable circuit architecture as claimed in claim 4, wherein the stack is arranged to match a footprint of access transistors disposed below the stack.

6. The reconfigurable circuit architecture as claimed in claim 1, wherein the circuit comprises multiple correlated electron switching elements with multiple states and a configuration power gate for initiating a writing of a state into the configurable volatile storage circuit.

7. The reconfigurable circuit architecture as claimed in claim 6, wherein the writing of a state into the configurable volatile storage circuit is performed more times compared to the writing of a state into the correlated electron switching elements over any reprogram cycle.

8. The reconfigurable circuit architecture as claimed in claim 1, wherein after writing a state into the configurable volatile storage circuit, the correlated electron switching elements are powered off.

9. The reconfigurable circuit architecture as claimed in claim 1, wherein an output of the circuit is connected to a multiplexer to select between entries in a look-up table.

10. The reconfigurable circuit architecture as claimed in claim 1, wherein each correlated electron switching element is connected to a node connected to a diode.

11. A method, comprising:
storing data for reconfiguration in correlated electron switching elements;
reading the data from the correlated electron switching elements; and
writing the data into a configurable volatile storage circuit,
wherein the correlated electron switching elements and the configurable volatile storage circuit are fabricated on a single die.

12. The method as claimed in claim 11, wherein the writing of a state into the configurable volatile storage circuit is performed more times compared to writing a state into the correlated electron switching elements over any reprogram cycle.

13. The method as claimed in claim 11, further comprising powering off the correlated electron switching elements after writing a state into the configurable volatile storage circuit.

14. The method as claimed in claim 11, further comprising outputting a signal to a multiplexer for selecting entries in a look-up table.

15. The method as claimed in claim 11, wherein each correlated electron switching element is connected to a node connected to a diode.

16. The method as claimed in claim 15, further comprising limiting a voltage across an element in the array using a diode connected to a node connected to the array.

* * * * *